(12) United States Patent
Murata et al.

(10) Patent No.: US 11,305,992 B2
(45) Date of Patent: Apr. 19, 2022

(54) OZONE GENERATION DEVICE AND POWER SUPPLY FOR OZONE GENERATION DEVICE

(71) Applicants: Kabushiki Kaisha Toshiba, Minato-ku (JP); Toshiba Infrastructure Systems & Solutions Corporation, Kawasaki (JP)

(72) Inventors: Takaaki Murata, Kawasaki (JP); Yuji Okita, Kawasaki (JP); Michiko Hashimoto, Atsugi (JP); Kie Kubo, Toshima (JP); Hiroshi Mochikawa, Hachioji (JP)

(73) Assignees: Kabushiki Kaisha Toshiba, Minato-ku (JP); Toshiba Infrastructure Systems & Solutions Corporation, Kawasaki (JP)

( * ) Notice: Subject to any disclaimer, the term of this patent is extended or adjusted under 35 U.S.C. 154(b) by 35 days.

(21) Appl. No.: 16/623,045

(22) PCT Filed: Sep. 19, 2017

(86) PCT No.: PCT/JP2017/033782
§ 371 (c)(1),
(2) Date: Dec. 16, 2019

(87) PCT Pub. No.: WO2018/235307
PCT Pub. Date: Dec. 27, 2018

(65) Prior Publication Data
US 2021/0147233 A1    May 20, 2021

(30) Foreign Application Priority Data
Jun. 22, 2017 (JP) .............................. JP2017-122223

(51) Int. Cl.
*C01B 13/11* (2006.01)
*H02M 7/5387* (2007.01)

(52) U.S. Cl.
CPC ....... *C01B 13/115* (2013.01); *H02M 7/53871* (2013.01); *C01B 2201/90* (2013.01)

(58) Field of Classification Search
CPC ... C01B 13/115; C01B 2201/90; C01B 13/11; C01B 2201/62; C01B 2201/22;
(Continued)

(56) References Cited

U.S. PATENT DOCUMENTS 6,156,453 A    12/2000  Shimizu et al.
2007/0205727 A1  9/2007  Tamita et al.
(Continued)

FOREIGN PATENT DOCUMENTS

JP    8-339809 A    12/1996
JP    2002-345263 A   11/2002
(Continued)

OTHER PUBLICATIONS

International Search Report dated Dec. 12, 2017 in PCT/JP2017/033782 filed Sep. 19, 2017.
(Continued)

*Primary Examiner* — Xiuyu Tai
(74) *Attorney, Agent, or Firm* — Oblon, McClelland, Maier & Neustadt, L.L.P.

(57) ABSTRACT

An ozone generation device includes an inverter, an ozone generator, and a reactor. The inverter turns on and off a switching element by pulse width modulation (PWM) control to convert DC power into AC power. In the ozone generator, voltage of the AC power is applied to a dielectric electrode, and discharge is generated in raw material gas flowing in a discharge gap between the dielectric electrode and a metal electrode, so that ozone is generated by the
(Continued)

discharge. The reactor is connected in series to a dielectric electrode, and reduces an inrush current that flows through the dielectric electrode when the switching element is switched from off to on by the PWM control by the inverter.

3 Claims, 5 Drawing Sheets

(58) Field of Classification Search
CPC .......... C01B 2201/64; C01B 2201/14; H02M 7/53871; H02M 7/48; H02M 7/4815; B01J 19/08; B01J 19/088; H05H 1/46; H05H 2242/20; Y02P 20/10; Y02B 20/22; Y02B 70/10; Y02B 20/00; H01J 37/32009; H01J 37/32348; H05B 41/2806; G09G 3/2965
See application file for complete search history.

(56) References Cited

U.S. PATENT DOCUMENTS

2010/0296981 A1* 11/2010 Takauchi ................ C01B 13/11
422/186.11
2016/0234925 A1  8/2016 Tabata et al.

FOREIGN PATENT DOCUMENTS

| JP | 2003-203800 A | | 7/2003 |
| JP | 2014-90641 A | | 5/2014 |
| JP | 2014-189455 A | | 10/2014 |
| WO | WO 2005/094138 A1 | | 10/2005 |
| WO | WO2015/049781 | * | 4/2015 |

OTHER PUBLICATIONS

Extended European Search Report dated Nov. 26, 2020 in corresponding European Application No. 17914136.1 citing documents AA and AO therein, 35 pages.

* cited by examiner

OZONE GENERATION DEVICE AND POWER SUPPLY FOR OZONE GENERATION DEVICE

CROSS-REFERENCE TO RELATED APPLICATIONS

This application is national stage application of International Application No. PCT/JP2017/033782, filed Sep. 19, 2017, which designates the United States, incorporated herein by reference, and which claims the benefit of priority from Japanese Application No. 2017-122223, filed on Jun. 22, 2017, the entire contents of each of which are incorporated herein by reference.

FIELD

Embodiments described herein relate generally to an ozone generation device and a power supply for an ozone generation device.

BACKGROUND

Ozone generation devices are driven by dedicated power supply because special load is applied. For example, a power supply for an ozone generation device converts AC power supplied from a three-phase power supply, which is an example of a commercial power supply, into DC power by the converter. Next, the power supply converts the DC power output from the converter into high-frequency AC power by a high-frequency inverter, and thereafter supplies the AC power to the ozone generation device through a transformer.

The ozone generation device is expressed by an equivalent circuit in which electrostatic capacitance representing a dielectric electrode and electrostatic capacitance representing a discharge gap between the dielectric electrode and a metal electrode are connected in series. When a discharge gap voltage applied to the discharge gap exceeds a discharge maintaining voltage, the discharge gap generates barrier discharge in raw material gas flowing in the discharge gap such that ozone is generated by the barrier discharge. The barrier discharge is expressed by an equivalent circuit of a Zener diode, which has constant voltage characteristics and maintains the discharge maintaining voltage during discharge. In this manner, the ozone generation device is applied with capacitive load, and hence a coil is connected in series or in parallel so as to cancel out the capacitive load in order to make the power factor closer to 1.

However, in the case where an inverter for converting DC power into AC power by pulse width modulation (PWM) control is used as a harmonic inverter in a power supply for an ozone generation device, the generation of ozone in the discharge gap may be unstable due to inrush current that flows through a dielectric electrode when a switching element included in the harmonic inverter is switched from off to on.

SUMMARY OF THE INVENTION

Problem to be Solved by the Invention

However, in the case where an inverter for converting DC power into AC power by pulse width modulation (PWM) control is used as a harmonic inverter in a power supply for an ozone generation device, the generation of ozone in the discharge gap may be unstable due to inrush current that flows through a dielectric electrode when switching elements included in the harmonic inverter are switched from off to on.

Means for Solving Problem

An ozone generation device according to an embodiment includes an inverter, an ozone generator, and a reactor. The inverter turns on and off switching elements by pulse width modulation (PWM) control to convert DC power into AC power, and outputs the converted AC power. The ozone generator in which voltage of the AC power output from the inverter is applied to a dielectric electrode, generates discharge in raw material gas flowing in a discharge gap between the dielectric electrode and a metal electrode to generate ozone by the discharge. The reactor is connected in series to the dielectric electrode, and reduces inrush current that flows through the dielectric electrode when the switching elements are switched from off to on by the PWM control in the inverter.

DETAILED DESCRIPTION

In general, an according to embodiments an ozone generation device includes an inverter, an ozone generator, and a reactor. The inverter turns on and off a switching element by pulse width modulation (PWM) control to convert DC power into AC power. The ozone generator in which voltage of the AC power is applied to a dielectric electrode, generates discharge in raw material gas flowing in a discharge gap between the dielectric electrode and a metal electrode to generate ozone by the discharge. The reactor is connected in series to the dielectric electrode, and reduces inrush current that flows through the dielectric electrode when the switching element is switched from off to on by the PWM control in the inverter.

Referring to the accompanying drawings, an ozone generation device and a power supply for an ozone generation device according to the present embodiment are described below.

First Embodiment

Figure 1:
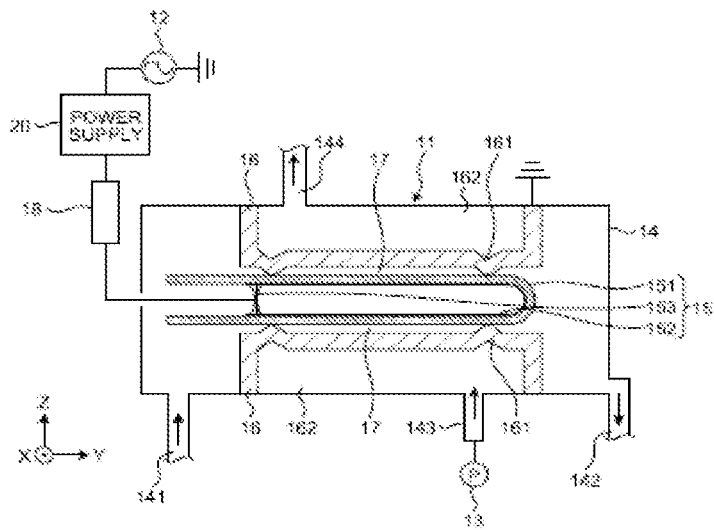
FIG. 1 is a diagram illustrating an example of a configuration of an ozone generation device according to a first embodiment.

FIG. 1 is a diagram illustrating an example of a configuration of an ozone generation device according to a first embodiment. The ozone generation device according to the first embodiment is a dielectric barrier ozone generation device. In FIG. 1, the Y axis is an axis along the center axis of an airtight container 14 described later, the X axis is an axis orthogonal to the Y axis, and the Z axis is an axis orthogonal to the Y axis and the X axis. As illustrated in FIG. 1, the ozone generation device includes a device main body 11, a high-voltage power supply 12, a cooling water supply unit 13, a fuse 18, and a power supply 20. The device main body 11 (example of an ozone generator) includes the airtight container 14, a dielectric electrode 15, and a metal electrode 16.

The airtight container 14 is a cylindrical container. Specifically, the airtight container 14 is a cylindrical container having a center axis along the Y axis direction. In the airtight container 14, the dielectric electrode 15 and the metal electrode 16 are housed. A gas inlet 141, a gas outlet 142, a cooling water inlet 143, and a cooling water outlet 144 are formed at an outer peripheral part of the airtight container 14. The airtight container 14 is supplied with raw material gas containing oxygen from the outside through the gas inlet 141. It is preferred to set a raw material gas pressure, which is the pressure of the raw material gas, to 0.1 to 0.3 MPa. The airtight container 14 discharges unreacted raw material gas and ozone to the outside through the gas outlet 142. Cooling water flows in the airtight container 14 through the cooling water inlet 143. The airtight container 14 discharges the cooling water to the outside through the cooling water outlet 144.

The dielectric electrode 15 is provided inside the airtight container 14. The dielectric electrode 15 has a dielectric portion 151, a conductive film 152, and a high-voltage supply terminal 153. The dielectric portion 151 contains dielectric material, and is formed into a cylindrical shape having a center axis along the Y axis direction. The center axis of the dielectric portion 151 is substantially parallel to the center axis of the airtight container 14. The conductive film 152 contains conductive material, and is provided inside the dielectric portion 151. The high-voltage supply terminal 153 is provided on the inner side of the conductive film 152 and electrically connected to the conductive film 152.

The metal electrode 16 contains conductive material. The metal electrode 16 is provided inside the airtight container 14 and on the outer side of the dielectric electrode 15. A discharge gap 17 is provided between the metal electrode 16 and the dielectric electrode 15. The metal electrode 16 is connected to the ground potential. The metal electrode 16 has a spacer 161. The spacer 161 protrudes from a part of the metal electrode 16 toward the dielectric electrode 15, and maintains the discharge gap 17 between the metal electrode 16 and the dielectric electrode 15. The metal electrode 16 forms a water path 162 with the inner peripheral surface of the airtight container 14, through which cooling water flows. The water path 162 is connected to the cooling water inlet 143 and the cooling water outlet 144 in the airtight container 14. Thus, cooling water flowing from the cooling water inlet 143 is discharged from the cooling water outlet 144 through the water path 162.

The high-voltage power supply 12 is electrically connected to the high-voltage supply terminal 153 through the fuse 18 and the power supply 20. The high-voltage power supply 12 applies voltage to the dielectric electrode (the conductive film 152) through the power supply 20, the fuse 18, and the high-voltage supply terminal 153. In this manner, discharge is generated in the raw material gas flowing in the discharge gap 17, and ozone is generated by the discharge. For example, the cooling water supply unit 13 is a pump. The cooling water supply unit 13 supplies cooling water from the cooling water inlet 143 in the airtight container 14 to the water path 162 in the airtight container 14.

Figure 2:
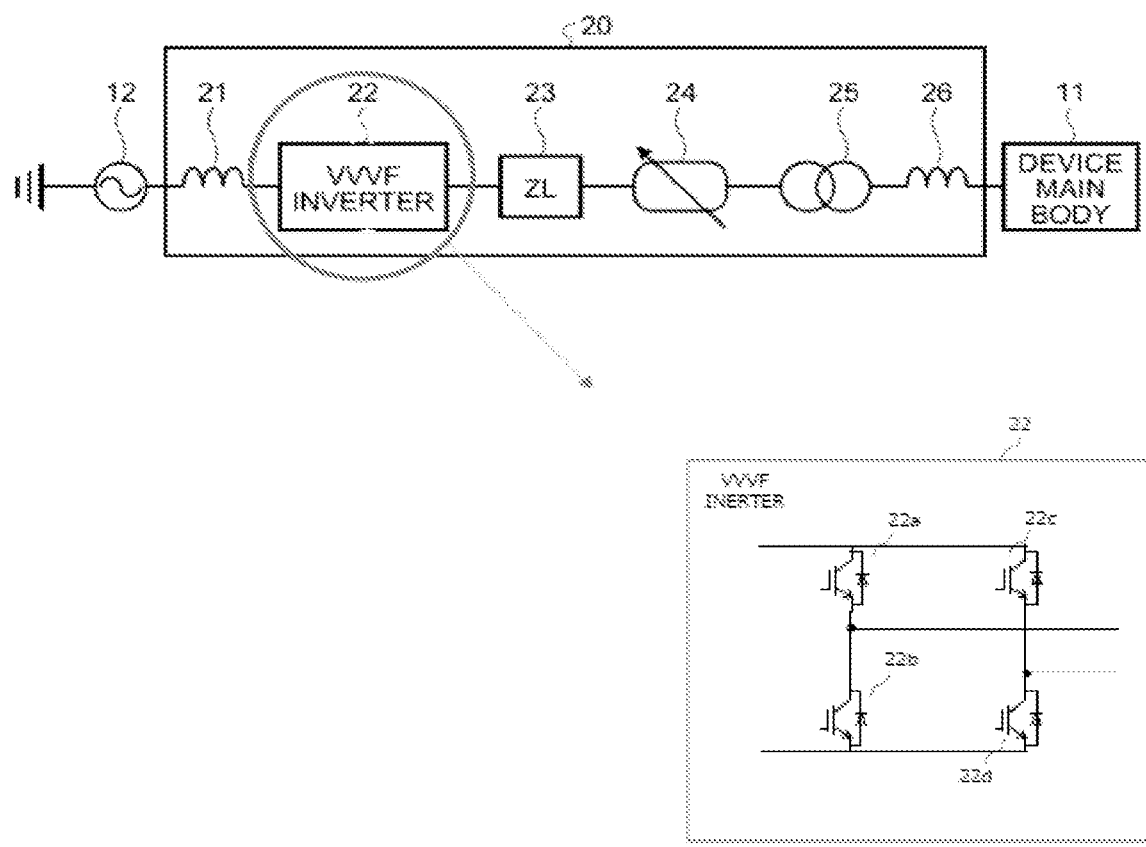
FIG. 2 is a diagram illustrating an example of a configuration of a power supply included in the ozone generation device according to the first embodiment.

Next, an example of the configuration of the power supply 20 included in the ozone generation device according to the first embodiment is described with reference to FIG. 2. FIG. 2 is a diagram illustrating an example of the configuration of the power supply included in the ozone generation device according to the first embodiment.

The power supply 20 converts AC power supplied from the high-voltage power supply 12 into AC power having a voltage set in advance, and applies the voltage of the AC power to the dielectric electrode 15. In the first embodiment, as illustrated in FIG. 2, the power supply 20 includes an input reactor 21, a VVVF inverter 22 including switching elements 22a 22b, 22c and 22d, a zero-phase reactor 23, a resistor 24, a transformer 25, and an output reactor 26.

The input reactor 21 is connected between the high-voltage power supply 12 and the VVVF inverter 22 described below, and suppresses harmonics included in AC power output from the VVVF inverter 22. The variable voltage variable frequency (VVVF) inverter 22 is an example of an inverter for turning on and off a switching elements 22a 22b, 22c and 22d under pulse width modulation (PWM) control and converting DC power into AC power and outputting the AC power. In the first embodiment, the VVVF inverter 22 has a converter for converting AC power supplied from the high-voltage power supply 12 into DC power. Next, the VVVF inverter 22 converts DC power output from the converter into AC power by PWM control. After that, the VVVF inverter 22 applies voltage of the AC power to the dielectric electrode 15 in the device main body 11.

In the first embodiment, a VVVF inverter in which the voltage of output AC power increases in proportion to the fundamental frequency of fundamental waveform of the output AC power is used for the VVVF inverter 22. The VVVF inverter 22 may be any inverter for converting DC power into AC power by PWM control. For example, a constant voltage variable frequency (CVVF) inverter for outputting AC power having a constant voltage even when the fundamental frequency increases may be used.

The zero-phase reactor 23 is a reactor for canceling zero-phase current of harmonic components in carrier frequency components flowing through wiring connecting the VVVF inverter 22 and the high-voltage supply terminal 153. The resistor 24 prevents short-circuit of the transformer 25 described below because current flows through a zero phase of the VVVF inverter 22. The transformer 25 is connected between the VVVF inverter 22 and the dielectric electrode 15, and increases the voltage of AC power output from the VVVF inverter 22 to a voltage set in advance (for example, 180, 200, 220 V).

The output reactor 26 (example of a reactor) is connected in series to the dielectric electrode 15, and is a reactor for reducing inrush current that flows through the dielectric electrode 15 when the switching elements 22a 22b, 22c and 22d are switched from off to on by PWM control in the VVVF inverter 22.

The device main body 11 is expressed by an equivalent circuit in which electrostatic capacitance representing the dielectric electrode 15 and electrostatic capacitance representing the discharge gap 17 are connected in series. When voltage applied to the discharge gap 17 exceeds a discharge maintaining voltage, which is voltage at which barrier discharge is generated in the discharge gap 17, the discharge gap 17 generates barrier discharge in the raw material gas flowing in the discharge gap 17, and generates ozone by the barrier discharge. The barrier discharge is expressed by an equivalent circuit of a Zener diode, which has constant voltage characteristics and maintains the discharge maintaining voltage during the barrier discharge. In this manner, the device main body 11 is applied with capacitive load, and hence if inrush current flows through the dielectric electrode 15 when the switching elements 22a 22b, 22c and 22d are switched from off to on by PWM control in the VVVF inverter 22, an adverse effect such as fluctuation in generated amount of ozone may occur.

In view of the above, in the first embodiment, the output reactor 26 is provided between the VVVF inverter 22 and the dielectric electrode 15 so as to reduce inrush current that flows through the dielectric electrode 15 when the switching elements 22a 22b, 22c and 22d are switched from off to on by PWM control and suppress fluctuation in generated amount of ozone in the discharge gap 17. In the first embodiment, the output reactor 26 has a reactance larger than the reactance of the device main body 11 when the carrier frequency is an angular frequency. In this manner, the capacitive components in the device main body 11 are canceled out such that the circuit of the entire ozone generation device becomes inductive, thereby preventing inrush current from easily flowing through the dielectric electrode 15.

As described above, the ozone generation device according to the first embodiment can reduce inrush current that flows through the dielectric electrode 15 when the is switching elements 22a 22b, 22c and 22d are switched from off to on by PWM control in the VVVF inverter 22, and can thus suppress the fluctuation in generated amount of ozone in the discharge gap 17.

Second Embodiment

A second embodiment is an example where a synchronous inverter in which the carrier frequency of carrier waves of output AC power increases continuously in proportion to the fundamental frequency of fundamental waveform of the output AC power is used as a VVVF inverter. In the following description, description of the same configurations as those in the first embodiment is omitted.

Figure 3:
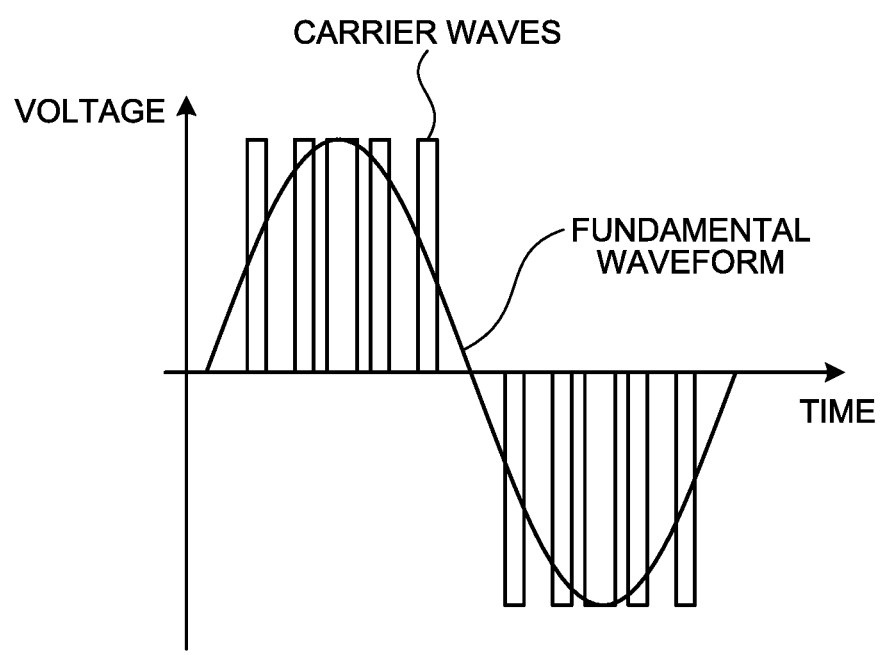
FIG. 3 is a diagram for describing an example of PWM control by a general-purpose VVVF inverter.

FIG. 3 is a diagram for describing an example of PWM control by a general-purpose VVVF inverter. In FIG. 3, the horizontal axis represents time, and the vertical axis represents voltage of AC power output from the general-purpose VVVF inverter. For cost reduction, many general-purpose VVVF inverters convert DC power into AC power by PWM control. In PWM control, in order to output AC power whose fundamental waveform is a sine wave voltage waveform, switching elements 22a 22b, 22c and 22d are repeatedly turned on and off to output pulse waves (carrier waves) having a harmonic carrier frequency, as illustrated in FIG. 3.

The general-purpose VVVF inverter is an asynchronous inverter in which the carrier frequency is not synchronized with the fundamental frequency of fundamental waveform. The state in which the carrier frequency is not synchronized with the fundamental frequency refers to a state in which when the carrier frequency is increased as the fundamental frequency is increased, the carrier frequency does not increase in proportion to the fundamental frequency, but the carrier frequency decreases each time the carrier frequency reaches an upper limit of the carrier frequency (hereinafter referred to as "carrier frequency upper limit"), and after that, the carrier frequency increases again. In other words, the state in which the carrier frequency is not synchronized with the fundamental frequency refers to a state in which when the carrier frequency is increased as the fundamental frequency is increased, the carrier frequency does not increase in proportion to the fundamental frequency but the carrier frequency changes discontinuously. The reason is that when the carrier frequency is increased as the fundamental frequency is increased, the carrier waves with the number of pulses set in advance for each fundamental frequency (hereinafter referred to as "predetermined pulse number") cannot be included in one cycle of the fundamental waveform. Thus, when the carrier frequency reaches the carrier frequency upper limit, the voltage of AC power output from the general-purpose VVVF inverter decreases.

Figure 4:
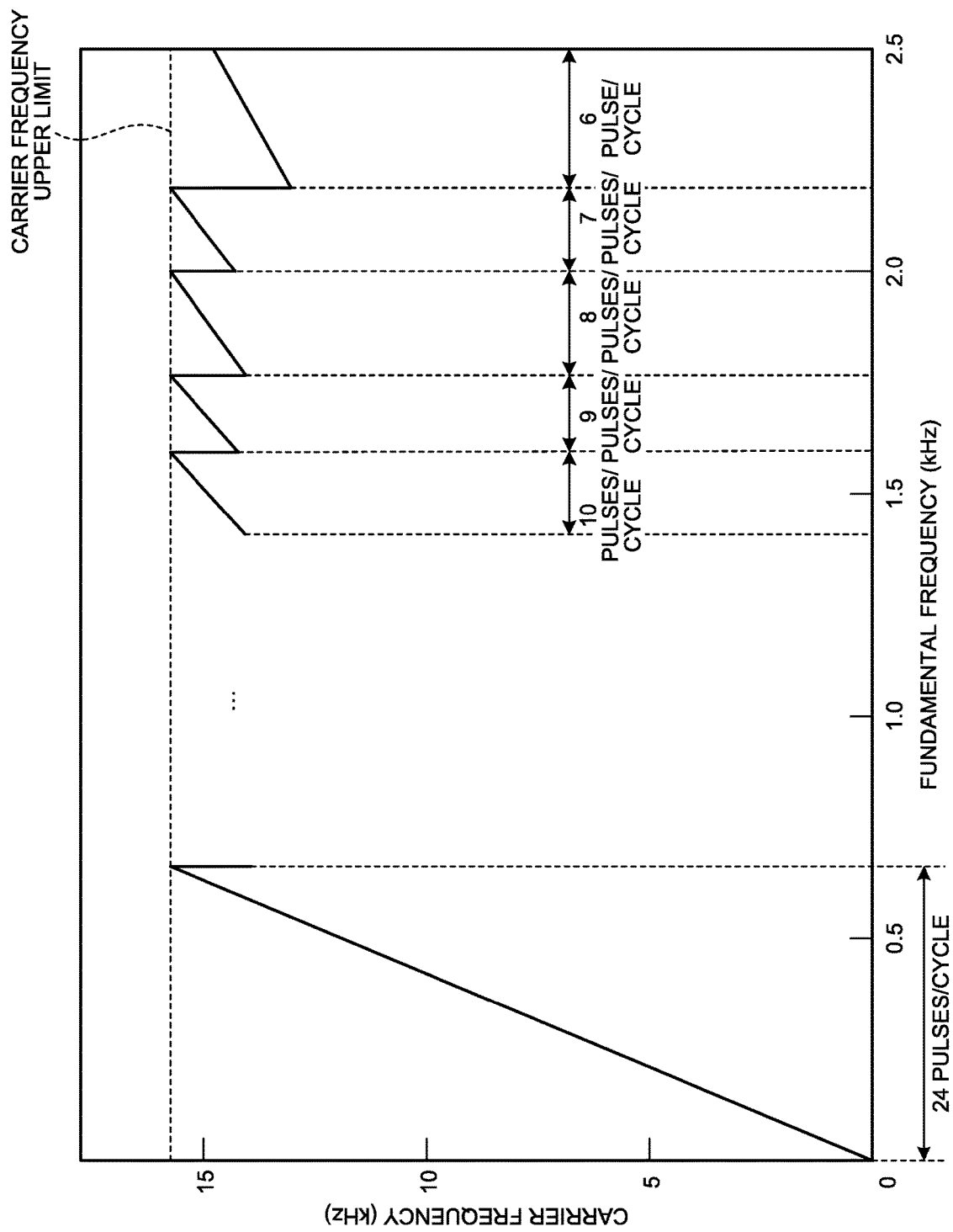
FIG. 4 is a diagram illustrating an example of a relation between a fundamental frequency and a carrier frequency in the general-purpose VVVF inverter.

FIG. 4 is a diagram illustrating an example of a relation between the fundamental frequency and the carrier frequency in the general-purpose VVVF inverter. In FIG. 4, the horizontal axis represents the fundamental frequency, and the vertical axis represents the carrier frequency. As illustrated in FIG. 4, in the general-purpose VVVF inverter, when the carrier frequency is increased in proportion to the fundamental frequency, the carrier frequency decreases if the carrier frequency reaches the carrier frequency upper limit (for example, 16.0 kHz) and the carrier waves with a predetermined pulse number (for example, 24 pulses) set in advance cannot be included in the fundamental frequency (for example, 0 to 0.7 kHz) for one cycle of the fundamental waveform. Accordingly, the voltage of AC power output from the general-purpose VVVF inverter also decreases.

Figure 5:
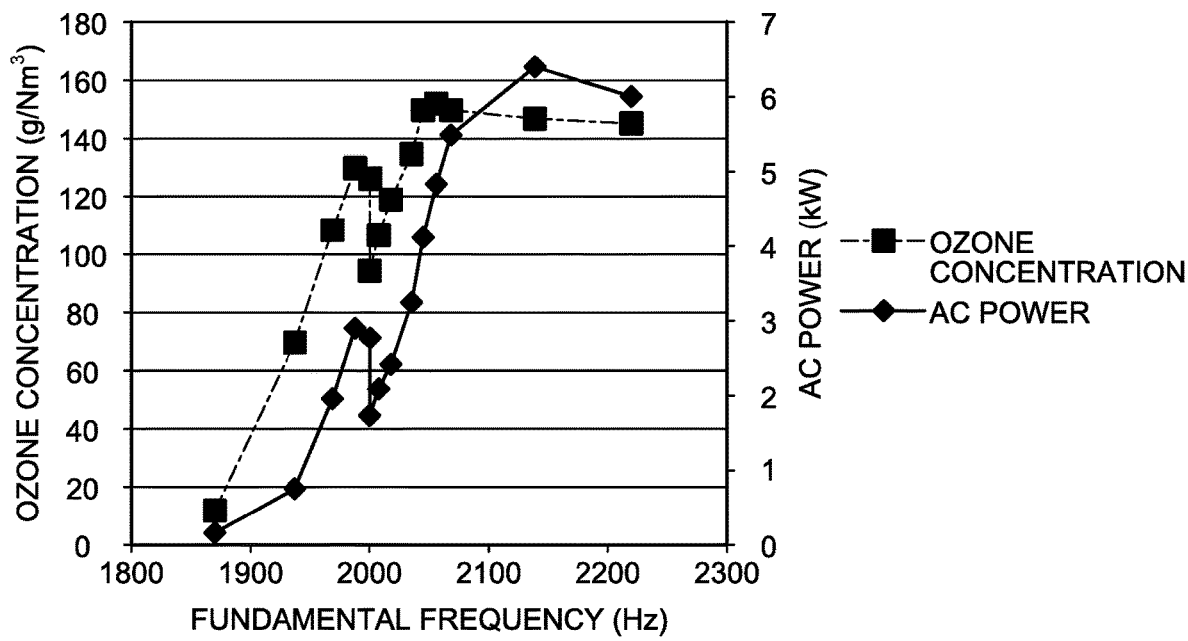
FIG. 5 is a diagram illustrating an example of a relation between a fundamental frequency and ozone concentration in an ozone generation device according to a second embodiment.

FIG. 5 is a diagram illustrating an example of a relation between the fundamental frequency and the ozone concentration in the ozone generation device according to the second embodiment. In FIG. 5, the horizontal axis represents the fundamental frequency, one vertical axis represents the concentration of ozone (hereinafter referred to as "ozone concentration") in the discharge gap 17, and the other vertical axis represents AC power output from the VVVF inverter 22. In the case where the general-purpose VVVF inverter is used for the VVVF inverter 22, when the fundamental frequency becomes 2.0 kHz and the carrier frequency reaches the carrier frequency upper limit, the carrier frequency decreases (see FIG. 4). Accordingly, as illustrated in FIG. 5, AC power output from the VVVF inverter 22 also decreases and hence the ozone concentration in the discharge gap 17 also decreases.

Figure 6:
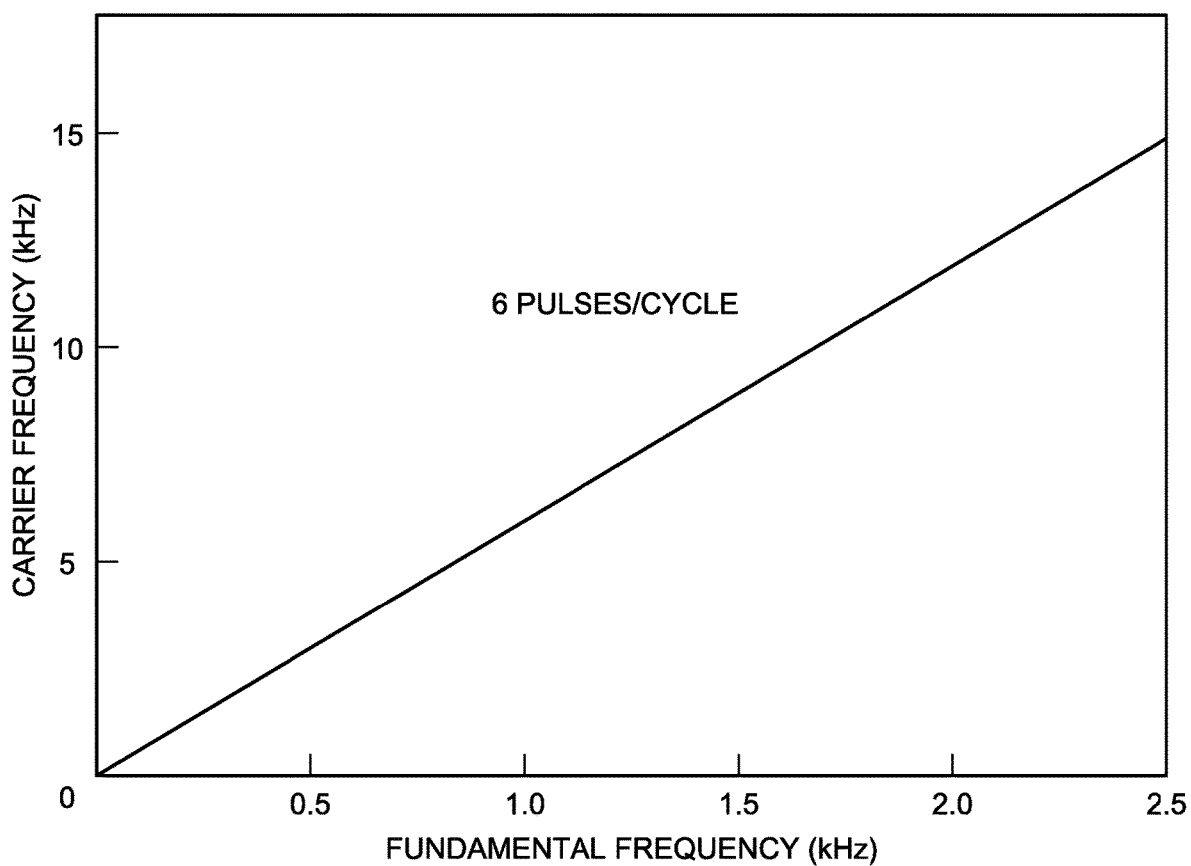
FIG. 6 is a diagram illustrating an example of a relation between a fundamental frequency and a carrier frequency in a VVVF inverter in the ozone generation device according to the second embodiment.

In view of the above, in the second embodiment, a synchronous inverter in which the carrier frequency increases continuously in proportion to the fundamental frequency is used as the VVVF inverter 22. FIG. 6 is a diagram illustrating an example of a relation between the fundamental frequency and the carrier frequency in the VVVF inverter in the ozone generation device according to the second embodiment. In FIG. 6, the horizontal axis represents the fundamental frequency, and the vertical axis represents the carrier frequency. As illustrated in FIG. 6, a synchronous inverter in which the carrier frequency increases continuously in proportion to the fundamental frequency is used as the VVVF inverter 22. In this manner, the fluctuation in AC power output from the VVVF inverter 22 can be prevented to prevent the decrease in ozone concentration.

As described above, the ozone generation device according to the second embodiment uses a synchronous inverter for the VVVF inverter 22 and can thus prevent the fluctuation in AC power output from the VVVF inverter 22, thus preventing the decrease in ozone concentration.

Third Embodiment

A third embodiment is an example where an asynchronous inverter in which the carrier frequency changes discontinuously as the fundamental frequency increases is used as a VVVF inverter. In the following description, description of the same configurations as those in the above-mentioned embodiments is omitted.

In the third embodiment, an asynchronous inverter (general-purpose VVVF inverter) in which the carrier frequency changes discontinuously as the fundamental frequency increases is used as the VVVF inverter 22. In the third embodiment, the reactance of the output reactor 26 is adjusted such that the carrier frequency increases continuously in proportion to the fundamental frequency of AC power output from the VVVF inverter 22 in the range of AC power (hereinafter referred to as "rated power") necessary for the generation of ozone in the device main body 11 (the discharge gap 17). The rated power is the range of AC power (for example, 5 to 100%) where ozone having an ozone concentration set in advance can be generated in the device main body 11. In this manner, the fundamental frequency where the carrier frequency changes discontinuously as the fundamental frequency increases is excluded from the fundamental frequency of AC power output from the VVVF inverter 22.

A common method for changing AC power output from a general-purpose VVVF inverter (asynchronous inverter) is to change the fundamental frequency of fundamental waveform of AC power output from the general-purpose VVVF inverter. The general-purpose VVVF inverter is frequently used to drive a motor, and controls the number of rotations of the motor by changing the fundamental frequency. When the general-purpose VVVF inverter is used as the VVVF inverter 22 in the ozone generation device, the ozone concentration can be adjusted by changing the fundamental frequency to change AC power supplied to the device main body 11.

However, the general-purpose VVVF inverter has a fundamental frequency (hereinafter referred to as "point of discontinuity") at which the carrier frequency changes discontinuously as the fundamental frequency increases. For example, as illustrated in FIG. 5, the general-purpose inverter has a point of discontinuity where the carrier frequency changes discontinuously in the vicinity of fundamental frequency of 2.0 kHz. At the point of discontinuity, as illustrated in FIG. 5, AC power output from the general-purpose VVVF inverter decreases, and hence the ozone concentration also changes discontinuously. The generated amount of ozone in the discharge gap 17 is determined by the product of the ozone concentration and the flow rate of raw material gas. The flow rate of the raw material gas is kept unchanged in many cases. Thus, when the ozone concentration decreases, the generated amount of ozone in the discharge gap 17 may decreases.

In view of the above, in the third embodiment, the reactance of the output reactor 26 is changed such that the point of discontinuity is shifted to the high frequency side with respect to the fundamental frequency at which AC power of rated power is output from the VVVF inverter 22. In this manner, when AC power of rated power is output from the VVVF inverter 22, the carrier frequency does not change discontinuously, and hence the decreases in ozone concentration can be prevented.

Figure 7:
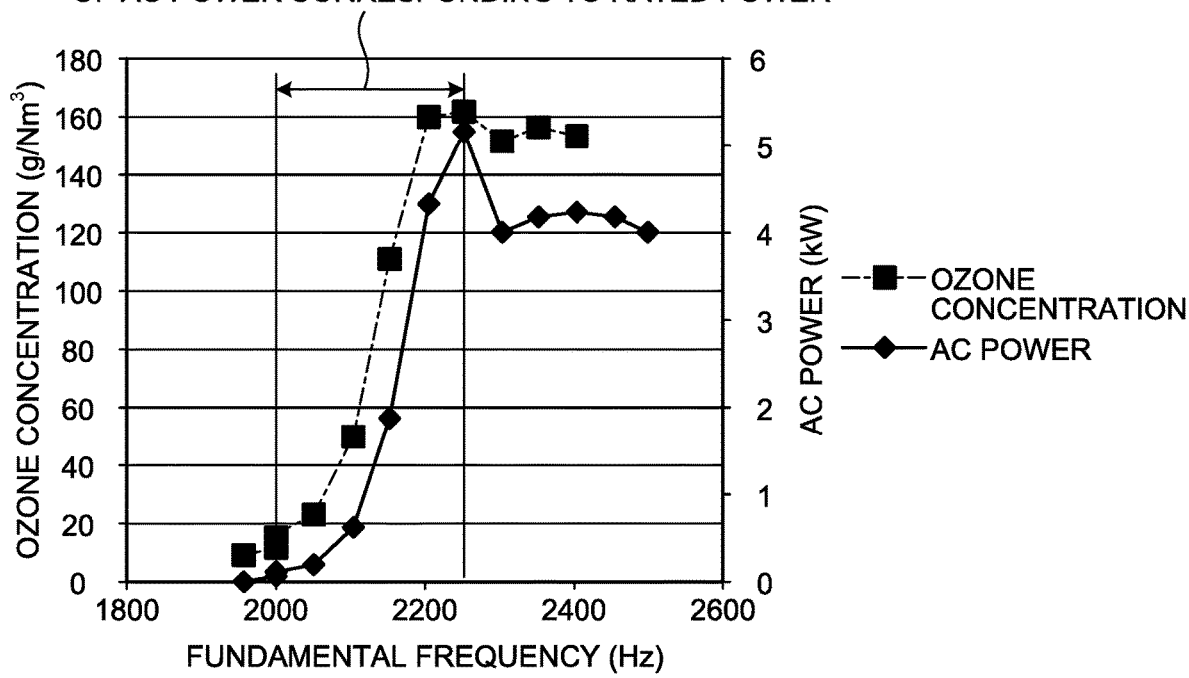
FIG. 7 is a diagram illustrating an example of a relation between a fundamental frequency and ozone concentration in an ozone generation device according to a third embodiment.

FIG. 7 is a diagram illustrating an example of a relation between the fundamental frequency and the ozone concentration in the ozone generation device according to the third embodiment. In FIG. 7, the horizontal axis represents the fundamental frequency, one vertical axis represents the ozone concentration, and the other vertical axis represents AC power output from the VVVF inverter 22. As illustrated in FIG. 7, the reactance of the output reactor 26 is changed to shift the point of discontinuity to 2.25 kHz. In this manner, when AC power corresponding to rated power (0.5 to 5.0 kW) is output from the VVVF inverter 22, the point of discontinuity is not included in the fundamental frequency, and the carrier frequency increases as the fundamental frequency increases. Consequently, the ozone concentration can be changed continuously.

As described above, in the ozone generation device according to the third embodiment, even in the case where a general-purpose VVVF inverter (asynchronous inverter) is used for the VVVF inverter 22, the point of discontinuity is not included in the fundamental frequency when AC power corresponding to rated power is output from the VVVF inverter 22, and hence even when the fundamental frequency is changed, ozone can be stably generated.

As described above, according to the first to the third embodiments, the fluctuation in generated amount of ozone in the discharge gap 17 can be suppressed.

While some embodiments of the present invention have been described, these embodiments have been presented as examples and are not intended to limit the scope of the invention. These novel embodiments can be implemented in various other forms, and can variously omitted, replaced, and changed within the range not departing from the gist of the invention. These embodiments and modifications thereof are included in the scope and gist of the invention, and included in the range of the invention recited in the claims and equivalents thereof.

The invention claimed is:

1. An ozone generation device, comprising:
an inverter including switching elements turned on and off by pulse width modulation (PWM) control to convert DC power into AC power;
an ozone generator that, in which voltage of the AC power is applied to a dielectric electrode, generates discharge in raw material gas flowing in a discharge gap between the dielectric electrode and a metal electrode to generate ozone by the discharge; and
a reactor that is connected in series to the dielectric electrode, and reduces inrush current that flows through the dielectric electrode when the switching elements are switched from off to on by the PWM control in the inverter,.
wherein the PWM control is carried out at a carrier frequency selected so that a reactance of the reactor at an angular frequency corresponding to the carrier frequency is larger than a reactance of the ozone generator.

2. An ozone generation device, comprising:
an inverter including switching elements turned on and off by pulse width modulation (PWM) control to convert DC power into AC power;
an ozone generator that, in which voltage of the AC power is applied to a dielectric electrode, generates discharge in raw material gas flowing in a discharge gap between the dielectric electrode and a metal electrode to generate ozone by the discharge; and a reactor that is connected in series to the dielectric electrode, and reduces inrush current that flows through the dielectric electrode when the switching elements are switched from off to on by the PWM control in the inverter, wherein the PWM control is carried out at a carrier frequency selected in accordance with given number of pulses contained in one cycle of a fundamental frequency of a fundamental waveform of the AC power so that the carrier frequency does not change discontinuously as the fundamental frequency increases.

3. The ozone generation device according to claim 2, wherein the given number of pulses is a maximum number of pulses contained in one cycle of the fundamental frequency of the fundamental waveform of the AC power so that the carrier frequency does not change discontinuously as the fundamental frequency increases.

\* \* \* \* \*